(12) United States Patent
Reznicek et al.

(10) Patent No.: US 11,114,607 B2
(45) Date of Patent: Sep. 7, 2021

(54) DOUBLE MAGNETIC TUNNEL JUNCTION DEVICE, FORMED BY UVH WAFER BONDING

(71) Applicant: International Business Machines Corporation, Armonk, NY (US)

(72) Inventors: Alexander Reznicek, Troy, NY (US); Virat Vasav Mehta, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/691,725

(22) Filed: Nov. 22, 2019

(65) Prior Publication Data
US 2021/0159389 A1    May 27, 2021

(51) Int. Cl.
*H01L 43/02* (2006.01)
*H01L 43/10* (2006.01)
*H01L 43/12* (2006.01)

(52) U.S. Cl.
CPC .............. *H01L 43/02* (2013.01); *H01L 43/10* (2013.01); *H01L 43/12* (2013.01)

(58) Field of Classification Search
CPC ......... H01L 43/08; H01L 43/02; H01L 43/12; H01L 43/10; G11C 11/1673; G11C 11/161; G11C 11/5607
See application file for complete search history.

(56) References Cited

U.S. PATENT DOCUMENTS

| 9,337,415 | B1 | 5/2016 | Oh et al. |
| 2017/0084825 | A1* | 3/2017 | Tsunoda .............. G11C 11/1673 |
| 2017/0294482 | A1 | 10/2017 | Hu et al. |
| 2018/0198058 | A1 | 9/2018 | Gottwald et al. |

FOREIGN PATENT DOCUMENTS

CN   104134748 B   1/2017

\* cited by examiner

*Primary Examiner* — Edward Chin
(74) *Attorney, Agent, or Firm* — Jeffrey M. Ingalls

(57) ABSTRACT

A method of manufacturing a double magnetic tunnel junction device is provided. The method includes forming a first magnetic tunnel junction stack. The first magnetic tunnel junction stack includes a first reference layer. The method also includes forming a second magnetic tunnel junction stack, where the second magnetic tunnel junction stack includes a second reference layer. The method also includes bonding the first magnetic tunnel junction stack to the second magnetic tunnel junction stack with ultra-high vacuum bonding to form the double magnetic tunnel junction device.

10 Claims, 14 Drawing Sheets

DOUBLE MAGNETIC TUNNEL JUNCTION DEVICE, FORMED BY UVH WAFER BONDING

BACKGROUND

The present disclosure relates to double magnetic tunnel junction ("DMTJ") devices and methods of manufacturing DMTJ devices. The tunnel magnetoresistance ("TMR") and the write efficiency are factors that affect the performance of DMTJs.

SUMMARY

Embodiments of the present disclosure relate to a method of manufacturing a double magnetic tunnel junction device. The method includes forming a first magnetic tunnel junction stack. The first magnetic tunnel junction stack includes a first reference layer. The method also includes forming a second magnetic tunnel junction stack, where the second magnetic tunnel junction stack includes a second reference layer. The method also includes bonding the first magnetic tunnel junction stack to the second magnetic tunnel junction stack with ultra-high vacuum bonding to form the double magnetic tunnel junction device.

Other embodiments relate to a double magnetic tunnel junction device formed by the method described above.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

DETAILED DESCRIPTION

Figure 1:
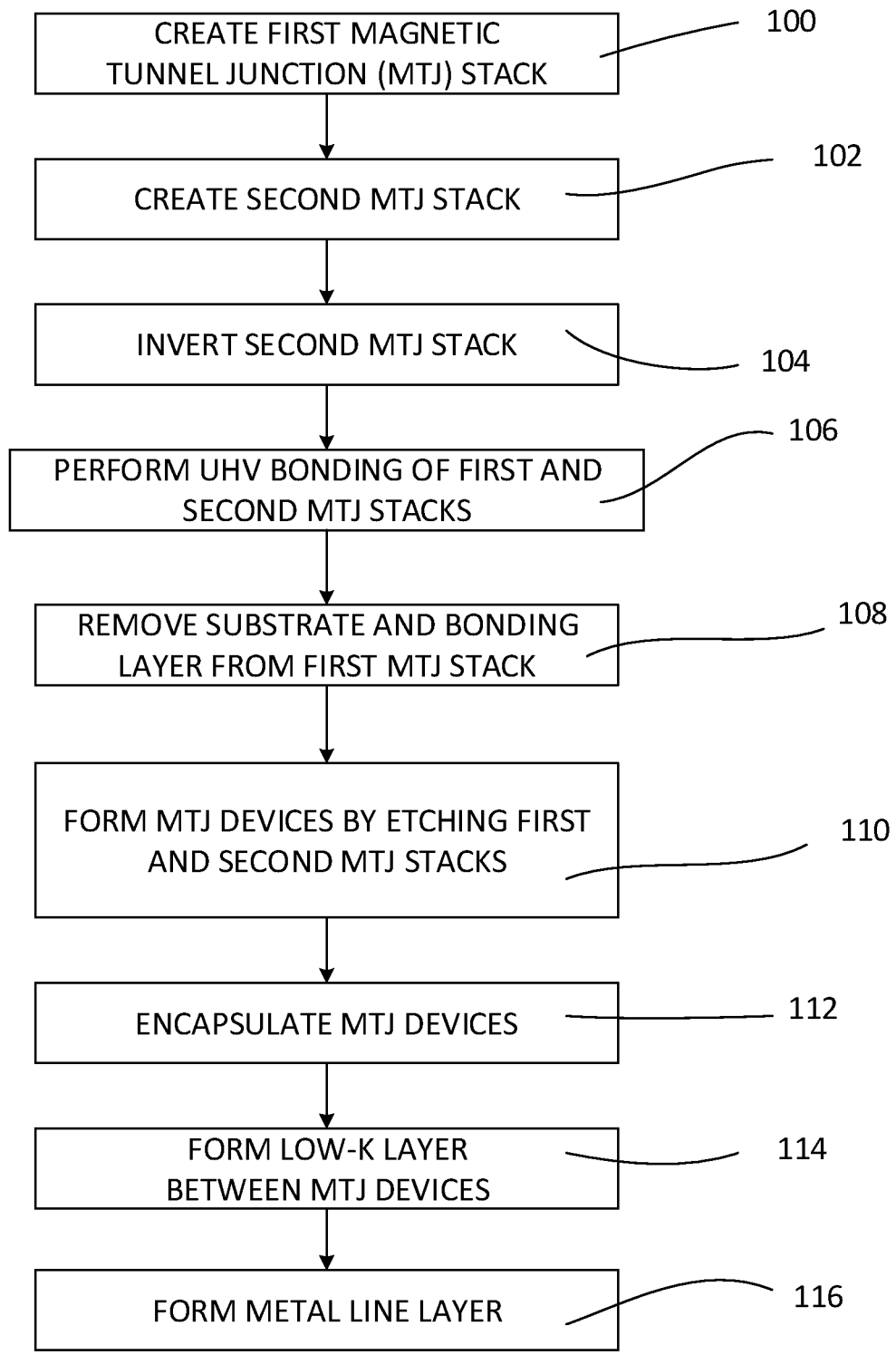
FIG. 1 is a flow diagram depicting a method of forming a double magnetic tunnel junction device, according to embodiments.

The present disclosure describes double magnetic tunnel junction ("DMTJ") devices and methods of manufacturing DMTJ devices. In particular, the present disclosure describes DMTJ devices that are formed by separately manufacturing two magnetic tunnel junction stacks ("MTJ") in an ultra-high vacuum environment, and then later connecting them together with ultra-high vacuum ("UHV") wafer bonding techniques.

Embedded DRAM ("eDRAM") is a dynamic random-access memory ("DRAM") integrated on the same die or multi-chip module ("MCM") of an application-specific integrated circuit ("ASIC") or microprocessor. eDRAM has been implemented in silicon-on-insulator ("SOI") technology, which refers to the use of a layered silicon-insulator-silicon substrate in place of conventional silicon substrates in semiconductor manufacturing. eDRAM technology has met with varying degrees of success, and demand for SOI technology as a server memory option has decreased in recent years.

Magnetoresistive random-access memory ("MRAM") devices using magnetic tunnel junctions ("MTJ") are one option to replace existing eDRAM technologies. MRAM is a non-volatile memory, and this benefit is a driving factor that is accelerating the development of this memory technology. Current MRAM MTJ structures are relatively slow, and the only way to reach MTJ write target speeds comparable to eDRAM (~5 ns) are with double magnetic tunnel junctions ("DMTJ"). DMTJ devices reduce the write current by factor of two.

In related DMTJ devices, the DMTJ stack is fabricated from the bottom up. The growth starts with a seed layer, that erases the crystal lattice and grain information of the underlying substrate. After the seed layer is grown, a reference layer is grown. For the reference layer, a preferred crystallographic grain orientation is either <111>face centered cubic ("FCC") or <0001>hexagon close packed ("HCP"). For example, a reference layer may be an HCP metal layer with high perpendicular magnetic anisotropy.

However, there is a problem with DMTJs because the reference layer for the top MTJ is situated on the top of the stack, thereby eliminating the advantage of having a lattice and grain information erasing layer (i.e., the seed layer). In this regard, the reference layer on the bottom MTJ has the advantage of being immediately formed on the very flat surface of the grain information erasing seed layer. However, as additional layers are formed on top of the reference layer for the first MTJ (e.g., magnetic free layers and tunnel barrier layers), the surface quality (e.g., surface flatness or crystal grain orientation) diminishes gradually with each subsequent layer being formed. As such, while the reference layer for the bottom MTJ device has the advantage of being formed on a relatively smooth surfaced underlying layer, by the time the reference layer for the top MTJ device is formed, its respective underlying layer has a lower surface quality. In other words, the relatively poor surface quality of the layer underlying the reference layer for the top MTJ stack would transmit to the top MTJ stack and inhibit its performance. Having such an imperfect top MTJ stack layer within the combined DMTJ stack would negatively impact the spin information in the DMTJ. Forming the top reference layer while maintaining a high tunnel magnetoresistance ("TMR") and write efficiency is one of the main challenges for fabrication of high performance DMTJs.

In certain embodiments, during formation of the DMTJ devices, each of the two MTJ stacks includes, at a minimum, a grain erasing layer (e.g., a seed layer, or a substrate having a <0001>HCP crystal orientation structure) and at least a portion of a reference layer formed on the grain erasing layer. Thus, both of the reference layers (or at least significant portions of the reference layers) are formed on their own respective grain information erasing base layer. Therefore, not only does the reference layer for the bottom MTJ device has the advantage of being formed on a relatively smooth underlying layer, but the top MTJ stack has this advantage as well. Thus, when the two stacks are combined, the DMTJ devices are able to maintain a high tunnel magnetoresistance ("TMR") and write efficiency.

As described in further detail below, different bonding interface locations between the first and second MTJ stacks (e.g., a bottom MTJ stack and a top MTJ stack) may be used. In the present embodiments, by forming the second MTJ stack separately from the first MTJ stack, the reference layer for the second MTJ stack is grown closer to the grain erasing layer of the second MTJ stack (i.e., rather than on top of the cumulative layered structure of the first MTJ stack). This has the effect of maintaining a high tunnel magnetoresistance ("TMR") and write efficiency for the DMTJ device.

The flowcharts and cross-sectional diagrams in the Figures illustrate methods of manufacturing DMTJs according to various embodiments. In some alternative implementations, the manufacturing steps in the flowcharts may occur in a different order that that which is noted in the Figures. Moreover, any of the layers depicted in the Figures may contain multiple sublayers.

Referring now to the drawings in which like numerals represent the same or similar elements and initially to FIG. 1, an exemplary method of manufacturing a DMTJ device to which the present embodiments may be applied is shown. In step 100, a first magnetic tunnel junction ("MTJ") stack is formed. In step 102, a second MTJ stack is formed. In step 104, the second MTJ stack is inverted, and is turned upside down relative to the first magnetic tunnel junction stack. The first magnetic tunnel junction stack is positioned in close proximity to the second magnetic tunnel junction stack. In step 106, ultrahigh vacuum ("UVH") bonding is performed between the first and second MTJ stacks to form a combined DMTJ stack.

In general, UHV wafer bonding is performed in an ultra-high vacuum system, where the pressure is reduced down to about the $10^{-9}$ to $10^{-10}$ Pa range. In certain embodiments, a combination of a UHV and MTJ deposition chamber with a UHV bonding system is used to allow stack deposition and bonding without air break. When the wafers are brought into contact, a bond wave propagates along the interface and a new solid is formed from the two pieces. The bonds are covalent, giving a very high bonding strength.

Forming the combined DMTJ structure by separately forming the MTJ stacks and then UVH bonding them together has the effect of eliminating (or significantly reducing) quality problems with the top reference layer. Because of the higher quality reference layer relative to related art techniques, the present embodiments provide DMTJ devices with a high TMR level and write efficiency.

Referring again to FIG. 1, in step 108, the substrate and the bonding layer are removed from the combined DMTJ stack. In step 110, the masking and ion beam etching ("IBE") is performed on the combined DMTJ stack to form a plurality of different DMTJ devices. In general, IBE (or Milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. However, it should be appreciated that any suitable etching method or photolithography method known by one of skill in the art may be used to form the plurality of DMTJ devices.

In step 112, the plurality of DMTJ devices are encapsulated with an encapsulating layer. In step 114, a low-k layer is formed between the devices. In general, in semiconductor manufacturing, a low-k is a material with a small relative dielectric constant relative to silicon dioxide. The low-k dielectric material layer separates the conducting parts (wire interconnects and transistors) of the different DMTJ devices from one another. In step 116, a metal line layer if formed on top of the DMTJ devices.

Figure 2:
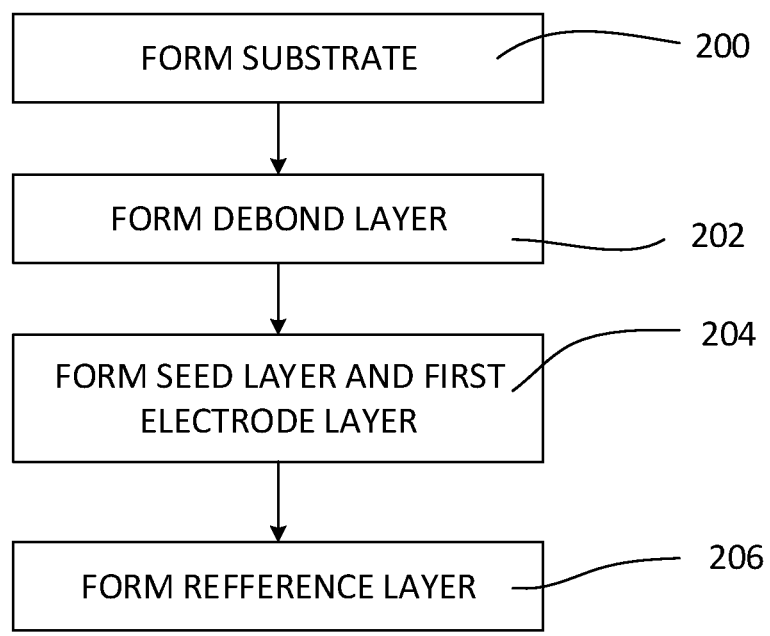
FIG. 2 is a flow diagram depicting a method of forming a first magnetic tunnel junction stack, according to embodiments.

Referring now to FIG. 2, an exemplary method of manufacturing a first MTJ stack (i.e., the upper MTJ stack) of a DMTJ device is shown, in accordance with an embodiment. In certain embodiments where the second MTJ stack includes an exposed MgO tunnel barrier layer, the first MTJ stack is grown prior to the second MTJ stack to minimize the amount of time that the MgO is exposed and degraded during the manufacturing process.

In step 200, a substrate is used as a starting structure. The substrate may be a silicon wafer, a quartz glass wafer, or any other suitable wafer with a rigid and smooth surface. In certain embodiments, the substrate does not produce outgassing when it is in an ultra-high vacuum ("UVH") environment. In certain embodiments, it is not necessary for the substrate to have high temperature resistivity.

In step 202, a debond layer is formed on top of the substrate. In one example, the debond layer is a thermal oxide layer. In another example, the debond layer is a UVH resistance glue, is rigid, has a smooth surface, and is not susceptible to outgas sing in a UVH environment. As with the substrate, and in certain embodiments, it is not necessary for the debond layer to have high temperature resistivity. It should be appreciated that the debond layer may be any suitable layer, and comprise any suitable combination of materials, that allows the substrate and the bonding layer to be later removed from the combined DMTJ device, as was described in step 108 of FIG. 1.

Referring again to FIG. 2, in step 204, a seed layer and a top electrode layer are formed. The seed layer is formed on the debond layer, and the top electrode is formed on the seed layer. In step 206, a second reference layer is formed on the seed/electrode layer to complete the upper MTJ stack. As mentioned above with regard to step 106 of FIG. 1, the second MTJ stack formed in FIG. 3 (i.e., the bottom MTJ stack) is bonded to the first MTJ stack formed in FIG. 2 (i.e., the top MTJ stack) with UVH bonding to form the combined DMTJ stack.

Figure 3:
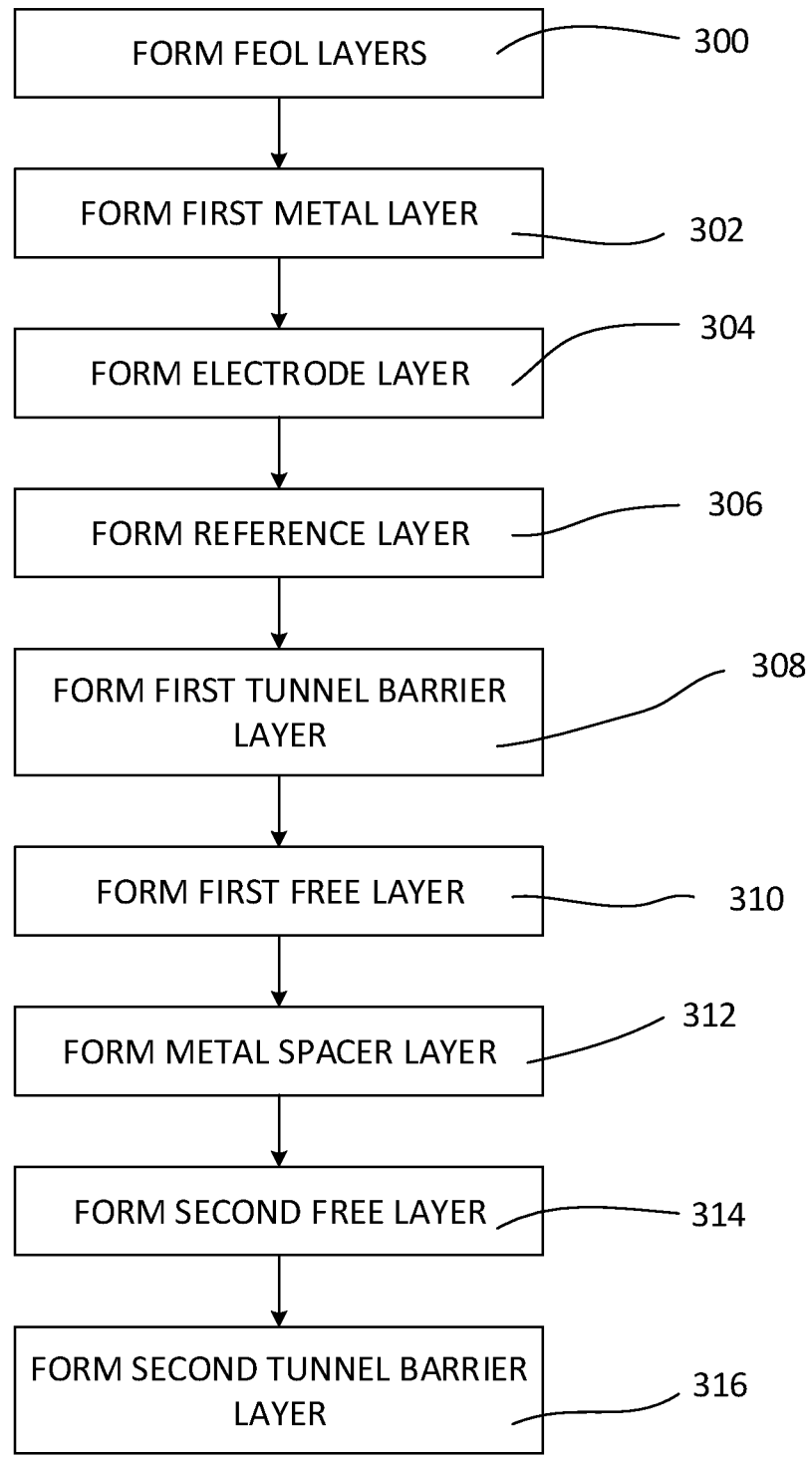
FIG. 3 is a diagram depicting a method of forming a second magnetic tunnel junction stack, according to embodiments.

Referring now to FIG. 3, an exemplary method of manufacturing a bottom MTJ stack (i.e., the lower MTJ stack) of a DMTJ device is shown, in accordance with an embodiment. In step 300, several font-end-of-line ("FEOL") layers are formed. In general, FEOL is the first portion of IC fabrication where the individual devices (transistors, capacitors, resistors, etc.) are patterned in the semiconductor. FEOL generally refers to every layer up to (but not including) the deposition of metal interconnect layers. In this example, the FEOL layers include transistors.

In step 302, a first metal layer is formed on top of the FEOL layers. In one example, the first metal layer includes contacts and vias. In step 304, a first electrode layer is formed on the first metal layer. In this example, the FEOL layers, the first metal layer and the first electrode layer are a starting structure upon which the bottom MTJ stack is later formed.

In certain embodiments, steps 306, 308, 310, 312, 314 and 316 are the steps for forming the bottom MTJ stack. In step 306, the reference layer is formed. Information is stored in the magnetic orientation of a free layer film in relation to that of the reference layer. The reference layer may be a single layer or a plurality of layers. In an embodiment, the reference layer of the bottom MTJ stack is a synthetic antiferromagnetic ("SAF") layer. In certain embodiments, the reference layer of the bottom and top MTJ stacks includes a plurality of sublayers (e.g., twenty or more sublayers), and an outermost sublayer is composed of CoFeB.

In step 308, the first tunnel barrier layer is formed on top of the reference film. In an embodiment, the tunnel barrier layer is a barrier, such as a thin insulating layer or electric potential, between two electrically conducting materials. Electrons (or quasiparticles) pass through the tunnel barrier by the process of quantum tunneling. In certain embodiment, the first tunnel barrier layer includes a sublayer composed of MgO. In these embodiments, the MgO sublayer of the tunnel barrier layer is bonded to the outermost CoFeB sublayer of the reference layer.

In step 310, the first free layer is formed. The first free layer is a magnetic free layer that is adjacent to the first tunnel barrier layer so as to be opposite the reference layer. The first magnetic free layer has a magnetic moment or magnetization that can be flipped. In step 312, a metal spacer layer is formed on the first free layer. In step 314, the second free layer is formed on the metal spacer layer. As such, the metal spacer layer is sandwiched between the first and second free layers.

In step 316, the second tunnel barrier layer is formed on the second free layer. In an embodiment, the second tunnel barrier includes an outermost sublayer comprised of the same material (e.g., MgO) as the first tunnel barrier layer. Thus, the bottom MTJ stack is formed by steps 306, 308, 310, 312, 314 and 316, and includes the reference layer, the first tunnel barrier layer, the first free layer, the metal spacer layer, the second free layer, and the second tunnel barrier layer. It should be appreciated that the bottom MTJ stack may include additional layers, omit certain layers, and each of the layers may include sublayers. Thus, in certain embodiments, the steps in FIG. 3 form a second wafer (i.e., a bottom MTJ stack) that will later be bonded to the first wafer (i.e., the top MTJ stack produced in FIG. 2).

Figure 4:
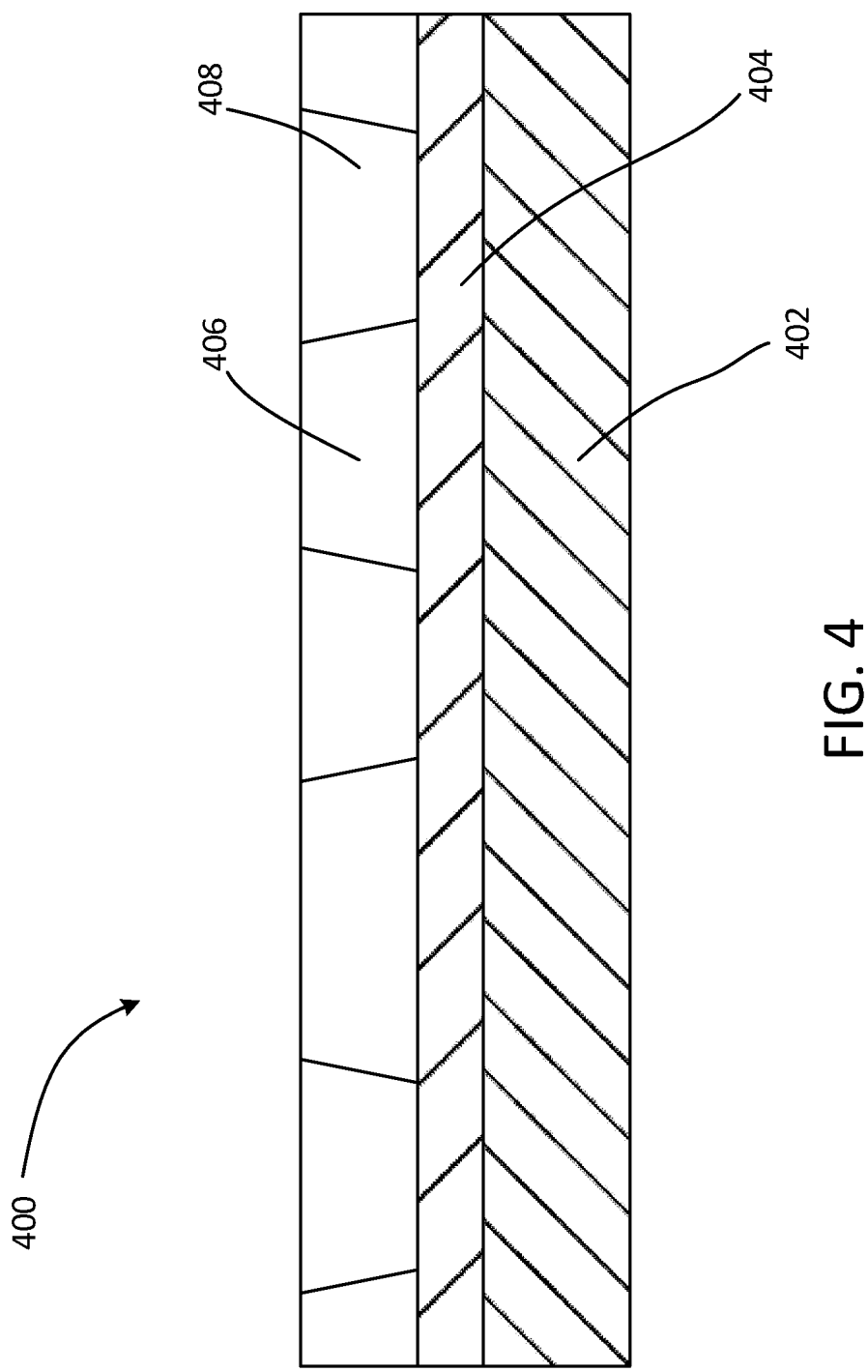
FIG. 4 is a cross-sectional view of the base layers that are formed underneath a first magnetic tunnel junction stack, according to embodiments.

Referring now to FIG. 4, a cross-sectional view of the starting structure of the bottom MTJ stack 400. Several front-end-of-line ("FEOL") layers 402 are formed. FEOL generally refers to every layer up to (but not including) the deposition of metal interconnect layers, and the FEOL layers do not include the bottom MTJ stack layers. In certain embodiments, FEOL layers 402 include transistors. A first metal layer 404 is formed on top of the FEOL layers 402. In this example, the first metal layer 404 includes contacts and vias. A first electrode layer 406 is formed on the first metal layer. The first electrode layer 406 includes several electrodes 408. In this example, the FEOL layers 402, the first metal layer 404 and the first electrode layer 406 are a starting structure upon which the bottom MTJ stack is later formed. Thus, layers 402, 404 and 406 form the starting structure of the bottom MTJ stack 400. It should be appreciated that other layers may be included or omitted in this starting structure, and any layer may have multiple sublayers.

Figure 5A:
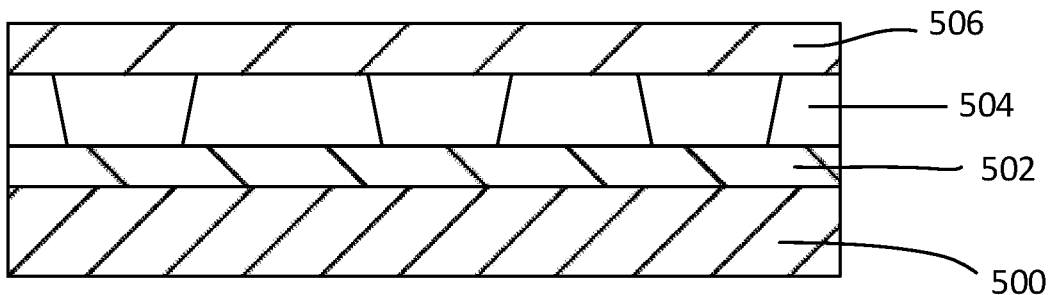
FIGS. 5A to 5F are cross-sectional views of several manufacturing steps for forming the first magnetic tunnel junction stack, according to embodiments.

Referring now to FIGS. 5A-5F, these figures show the formation of the bottom MTJ stack layers on top of the starting structure. FIG. 5A shows the FEOL layers 500, the first metal layer 502 and the first electrode layer 504 comprising the starting structure that is shown in FIG. 4. A In FIG. 5A, a first reference layer 506 is formed. The first reference layer 506 may comprise a plurality of sublayers (e.g., twenty or more sublayers). In certain embodiments where the first reference layer has multiple sublayers, the outermost sublayer is comprised of CoFeB.

Figure 5B:
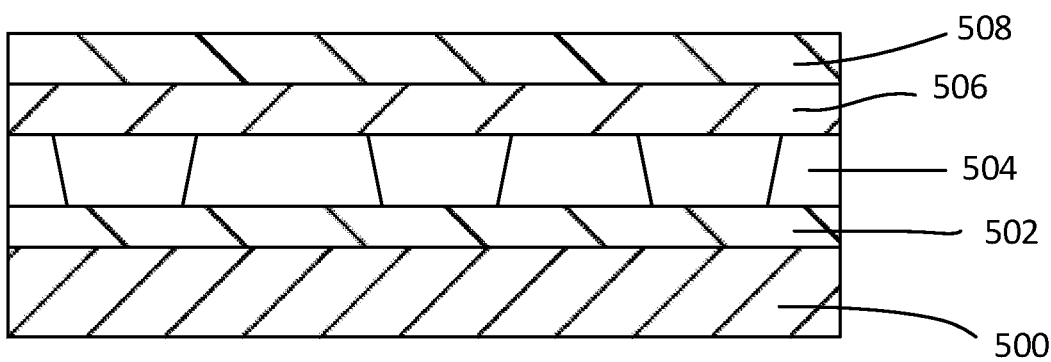

In FIG. 5B, a first tunnel barrier layer 508 is formed on the first reference layer 506. In certain embodiments, the first tunnel barrier layer 508 is comprised of MgO. However, it should be appreciated that other suitable materials or combination of materials may be used for the first tunnel barrier layer 508. In certain embodiments, the MgO of the first tunnel barrier layer 508 is bonded to the CoFeB sublayer of the underlying first reference layer 506.

Figure 5C:
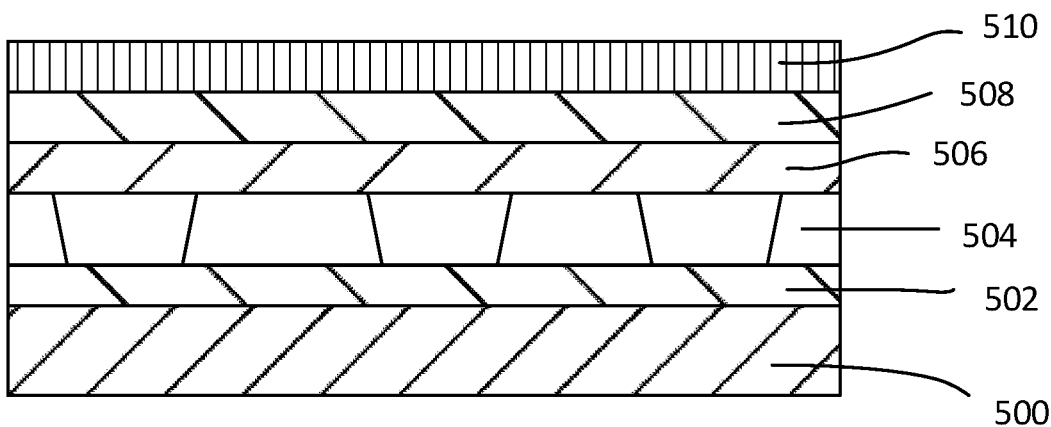

In FIG. 5C, a first free layer 510 is formed on the first tunnel barrier layer 508. The first free layer 510 is a magnetic free layer and has a magnetic moment or magnetization that can be flipped. The first free layer 510 may be made of any suitable materials known in the art.

Figure 5D:
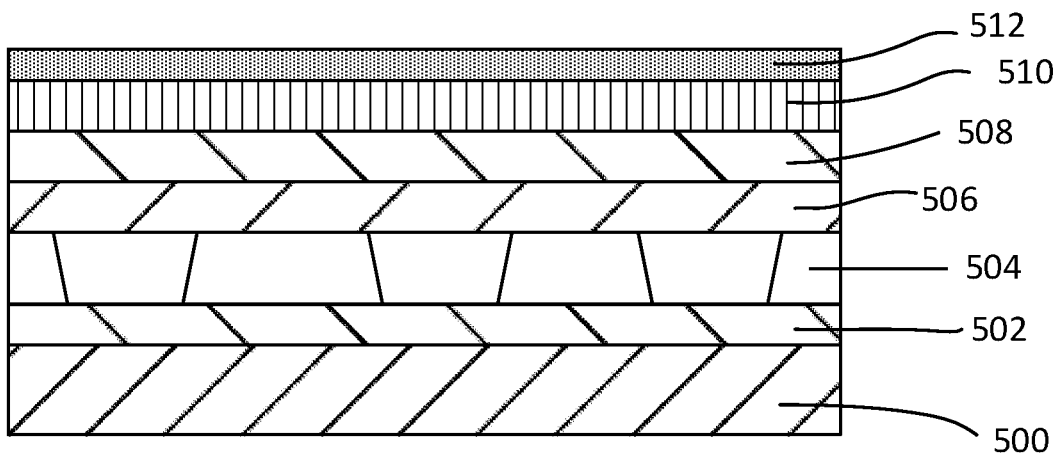
Figure 5E:
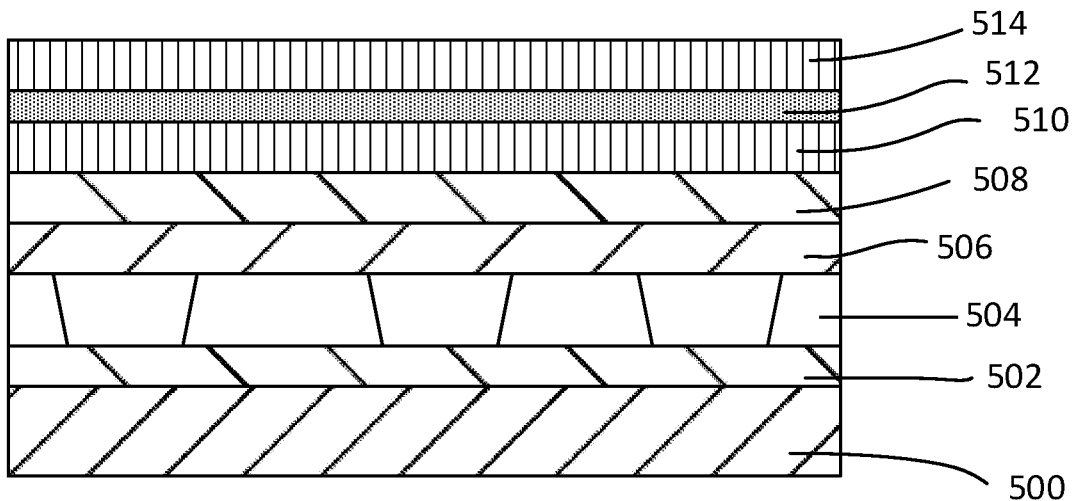

In FIG. 5D, a metal spacer layer 512 is formed on the first free layer 510. In FIG. 5E, a second free layer 514 is formed on the metal spacer layer 512. The second free layer 514 may be formed from the same materials as the first free layer 510, or of different materials. Thus, the metal spacer layer 512 is sandwiched between the first free layer 510 and the second free layer 512.

Figure 5F:
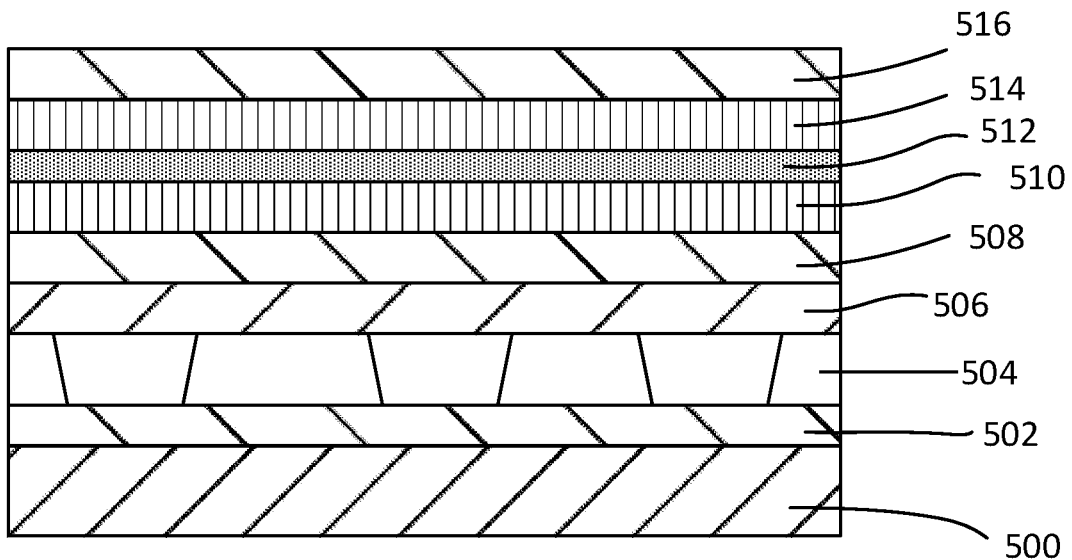

In FIG. 5F, a second tunnel barrier layer 516 is formed on the second free layer 514. The second tunnel barrier layer 516 may be made of the same materials as the first tunnel barrier layer 508, or it may be made of different materials. In certain embodiments, the second tunnel barrier layer 516 is composed of MgO, and this MgO forms an upper exposed surface of the bottom MTJ stack. As discussed herein, the MgO is susceptible to degradation, even in the UHV environment. Thus, it is generally preferable to minimize the amount of time that the MgO second tunnel barrier layer 516 is exposed. As such, in certain embodiments, the upper MTJ stack shown in FIGS. 6A-6D (i.e., which does not include a MgO tunnel barrier layer) may be formed prior to the bottom MTJ stack shown in FIGS. 5A-5F to minimize the exposure of the MgO.

Figure 6A:
FIGS. 6A to 6D are cross-sectional views of several manufacturing steps for forming the second magnetic tunnel junction stack, according to embodiments.

Referring now to FIGS. 6A-6D, the upper MTJ stack is formed. As shown in FIG. 6A, the substrate 600 is provided as a starting structure. The substrate 600 may be a silicon wafer, a quartz glass wafer, or any other suitable wafer with a rigid and smooth surface. In certain embodiments, the substrate 600 does not produce outgassing when it is in an ultra-high vacuum ("UVH") environment. In certain embodiments, it is not necessary for the substrate 600 to have high temperature resistivity.

Figure 6B:
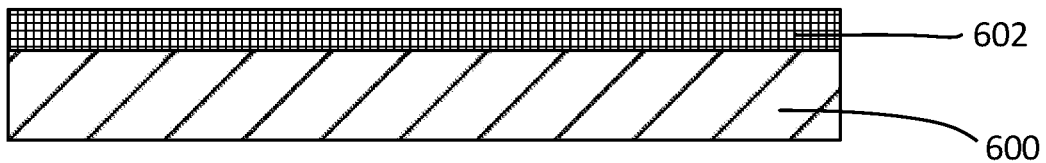

As shown in FIG. 6B, a debond layer 602 is formed on top of the substrate 600. In one example, the debond layer 602 is a thermal oxide layer. In another example, the debond layer 602 is a UVH resistance glue, is rigid, has a smooth surface, and is not susceptible to outgassing in a UVH environment. As with the substrate 600, and in certain embodiments, it is not necessary for the debond layer 602 to have high temperature resistivity. It should be appreciated that the debond layer 602 may be any suitable layer, and comprise any suitable combination of materials, that allows the substrate 600 and the debond layer 602 to be later removed from the combined DMTJ device, as was described in step 108 of FIG. 1.

Figure 6C:
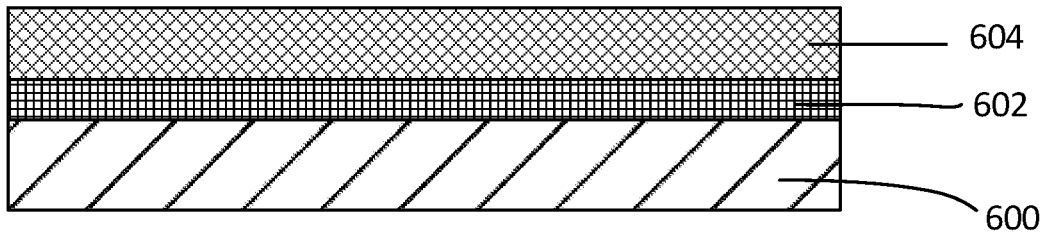

As shown in FIG. 6C, a layer 604 is formed that includes several sublayers (not shown). Layer 604 includes a debond layer, followed by a top electrode layer, followed by a seed layer. It should be appreciated that the seed layer portion of this layer 604 has a crystal lattice and grain structure that is suitable as a growth surface for the second reference layer 606.

Figure 6D:
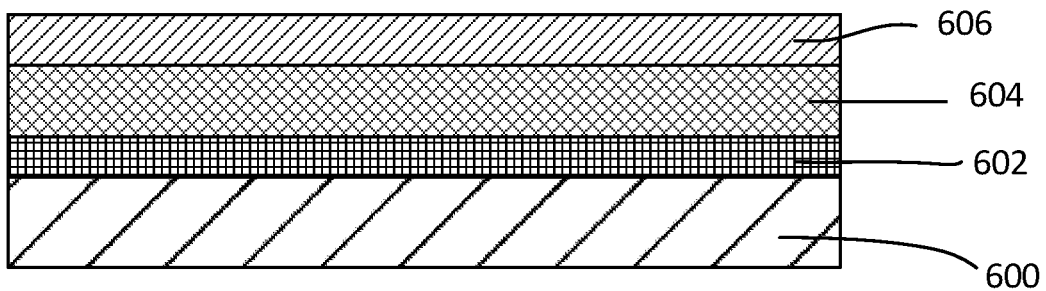

As shown in FIG. 6D, a second reference layer 606 is formed on the electrode/seed layer 604 to complete the upper MTJ stack. The first reference layer 506 (see, FIG. 5) and the second reference layer 606 may be of the same or different materials, and both layers may include a plurality of sublayers.

Figure 7:
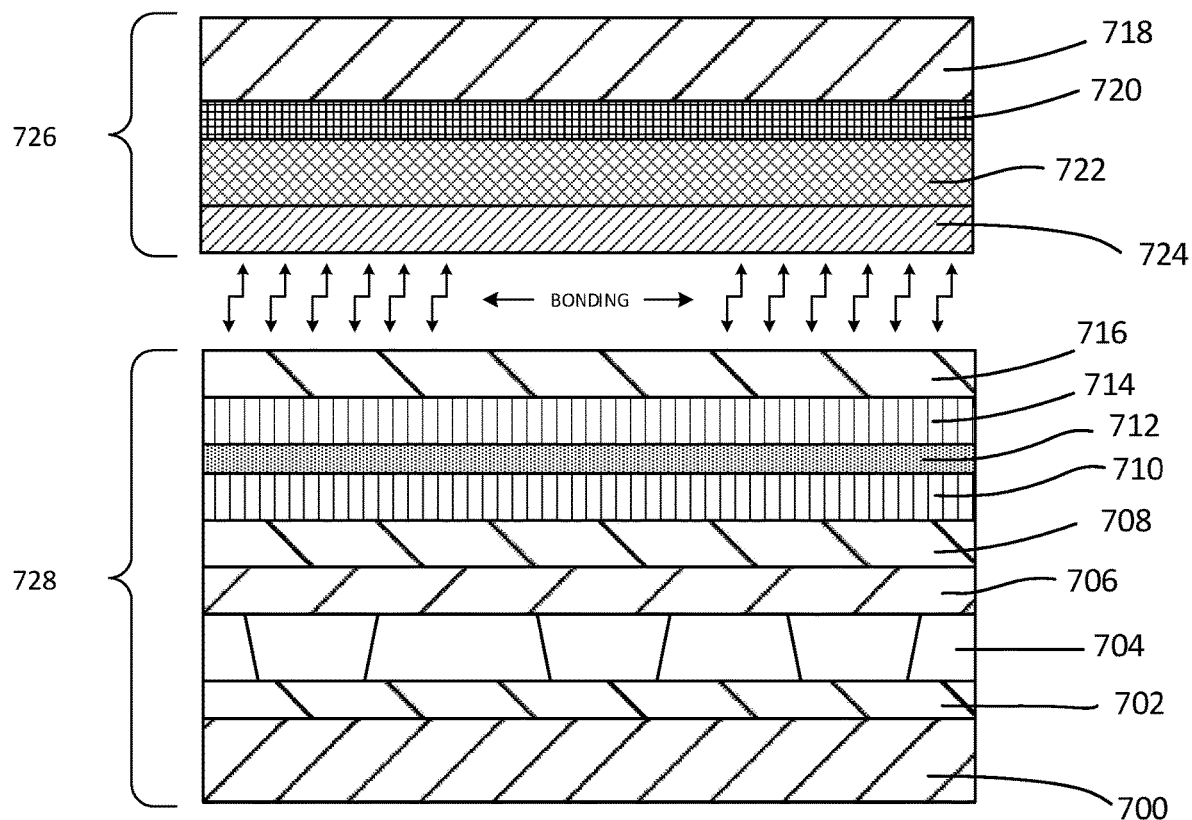
FIG. 7 is a cross-sectional view depicting bonding of the first magnetic tunnel junction stack shown in FIG. 5F to the second magnetic tunnel junction stack shown in FIG. 6D, according to embodiments.

Referring now to FIG. 7, this figure illustrates the step prior to bonding the top MTJ stack 726 to the bottom MTJ stack 728. As shown in FIG. 7, the bottom MTJ stack includes the FEOL layers 700, the first metal layer 702, the first electrode layer 704, the first reference layer 706, the first tunnel barrier layer 708, the first free layer 710, the metal spacer layer 712, the second free layer 714 and the second tunnel barrier layer 716. Also, the top MTJ stack includes the substrate 718, the debond layer 720, the second electrode layer 722 and the second reference layer 724. As shown in FIG. 7, the top MTJ stack 726 has been inverted and placed in proximity of the bottom MTJ stack 728 in an UHV environment.

Figure 8:
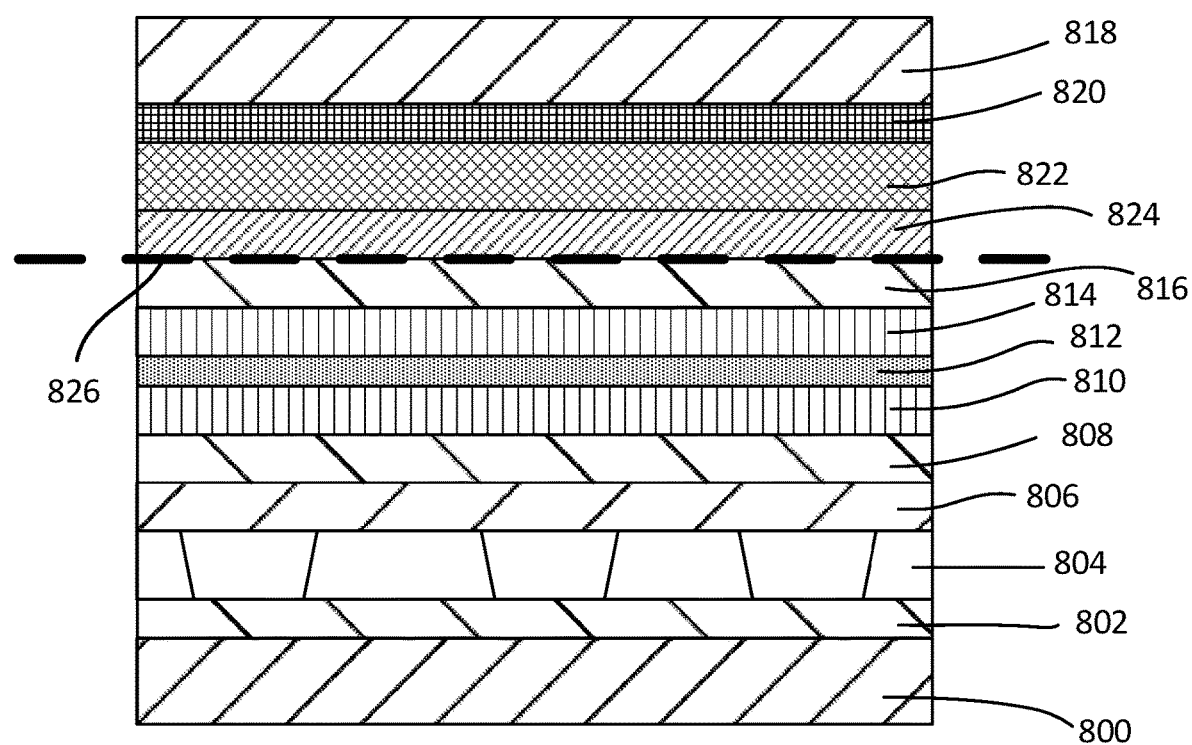
FIG. 8 is a cross-sectional view the first magnetic tunnel junction stack shown in FIG. 7 bonded to the second magnetic tunnel junction stack also shown in FIG. 7, according to embodiments.

Referring now to FIG. 8, this figure illustrates the step after bonding the top MTJ stack 726 to the bottom MTJ stack 728 (see, FIG. 7). As shown in FIG. 8, the completed DMTJ stack includes the FEOL layers 800, the first metal layer 802, the first electrode layer 804, the first reference layer 806, the first tunnel barrier layer 808, the first free layer 810, the metal spacer layer 812, the second free layer 814 and the second tunnel barrier layer 816, the substrate 818, the debond layer 820, the second electrode layer 822 and the second reference layer 824. As shown in FIG. 8, the bonding interface 826 is at the interface of the second reference layer 824 and the second tunnel barrier layer 816. Although the bonding interface is shown at this location, other suitable bonding interfaces are possible, and are discussed below with regard to FIG. 13.

Figure 9:
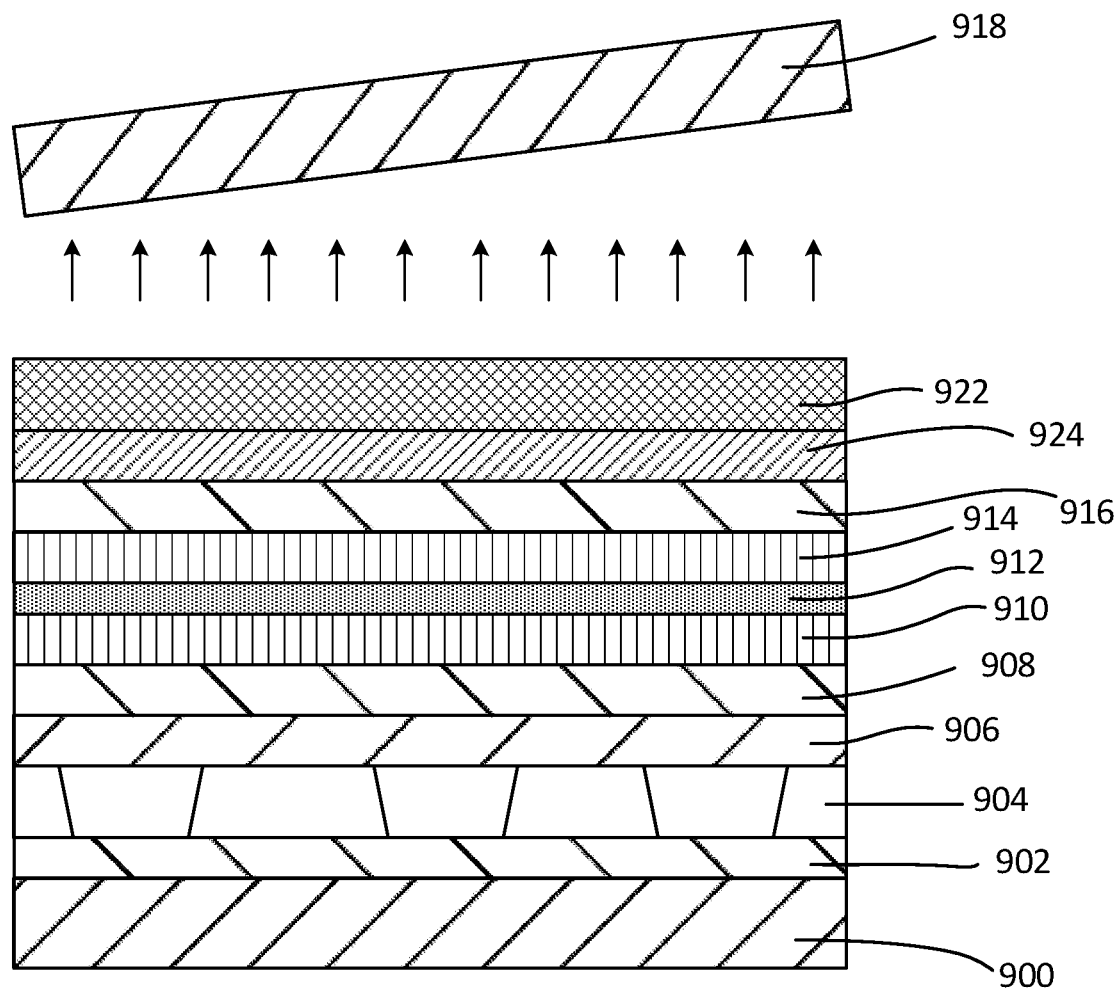
FIG. 9 is a cross-section view of removal of the substrate from the combined first and second magnetic tunnel junction stack shown in FIG. 8, according to embodiments.

Referring now to FIG. 9, this figure shows the removal of the substrate 918. As shown in FIG. 9, the DMTJ stack includes the FEOL layers 900, the first metal layer 902, the first electrode layer 904, the first reference layer 906, the first tunnel barrier layer 908, the first free layer 910, the metal spacer layer 912, the second free layer 914 and the second tunnel barrier layer 916, the substrate 918, the debond layer 920, the second electrode layer 922 and the second reference layer 924. In FIG. 9, the substrate 918 and the debond layer 820 (not shown) have been removed from the remainder of the structure of the DMTJ stack.

Figure 10:
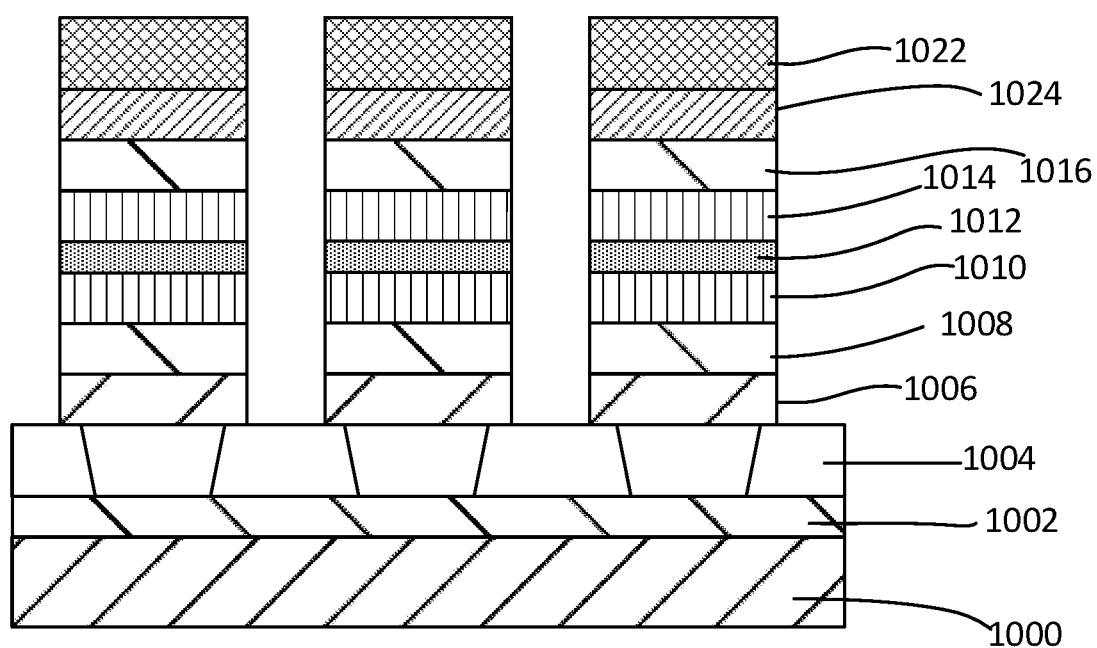
FIG. 10 is a cross-sectional view of a plurality of double magnetic junction devices that are formed by removing portions of the combined first and second magnetic tunnel junction stack shown in FIG. 9, according to embodiments.

Referring now to FIG. 10, this figure shows the DMTJ stack after it has been processed to form the plurality of individual DMTJ devices. As shown in FIG. 10, the DMTJ stack includes the FEOL layers 1000, the first metal layer 1002, the first electrode layer 1004, the first reference layer 1006, the first tunnel barrier layer 1008, the first free layer 1010, the metal spacer layer 1012, the second free layer 1014 and the second tunnel barrier layer 1016, the second reference layer 1024 and the second electrode layer 1022. As shown in FIG. 10, masking and ion beam etching ("IBE") is performed on the combined DMTJ stack to form a plurality of different DMTJ devices. Although the patterning and etching of the devices has been described with respect to IBE, it should be appreciated that any suitable etching method or photolithography method known by one of skill in the art may be used to form the plurality of DMTJ devices.

Figure 11:
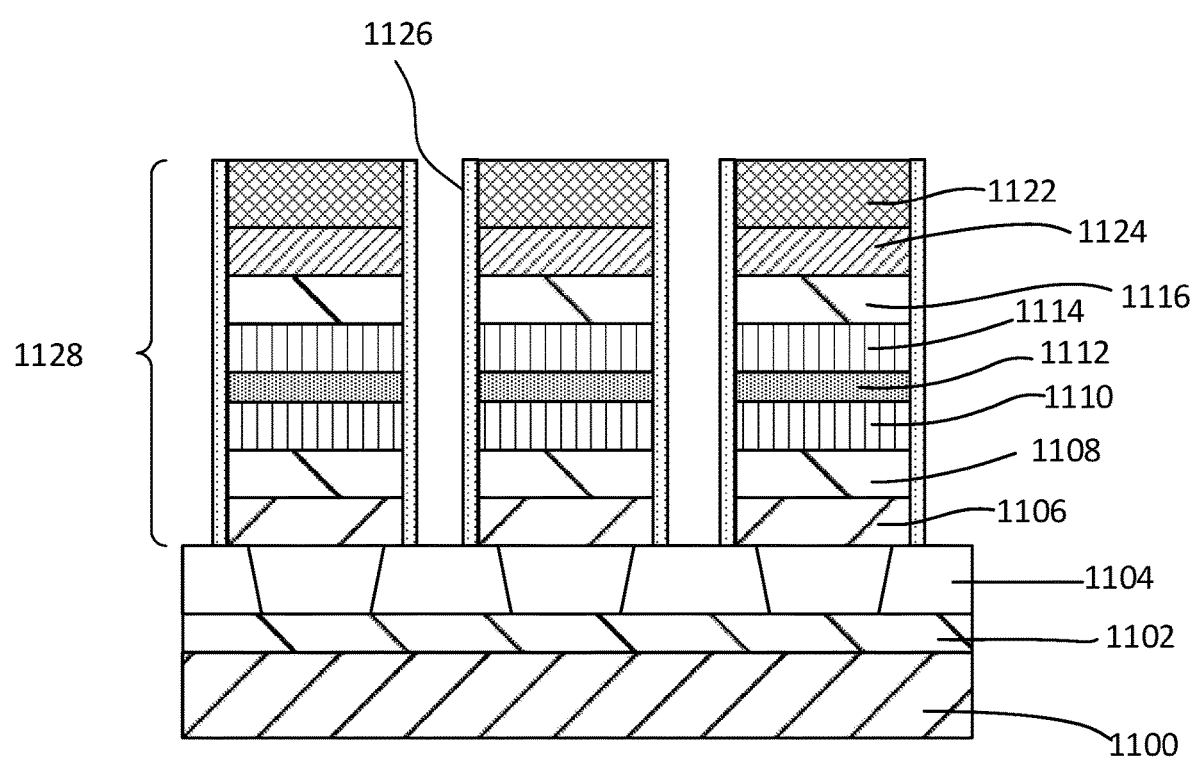
FIG. 11 is a cross-sectional view of the plurality of double magnetic junction devices shown in FIG. 10 that have been encapsulated, according to embodiments.

Referring now to FIG. 11, the plurality of DMTJ devices are encapsulated with an encapsulating layer 1126. The encapsulating layer 1126 is a protective layer that covers the sidewalls of the DMTJ devices 1128. In particular, the encapsulating layer covers the sidewalls of the first reference layer 1106, the first tunnel barrier layer 1108, the first free layer 1110, the metal spacer layer 1112, the second free layer 1114 and the second tunnel barrier layer 1116, the second reference layer 1124 and the second electrode layer 1122.

Figure 12:
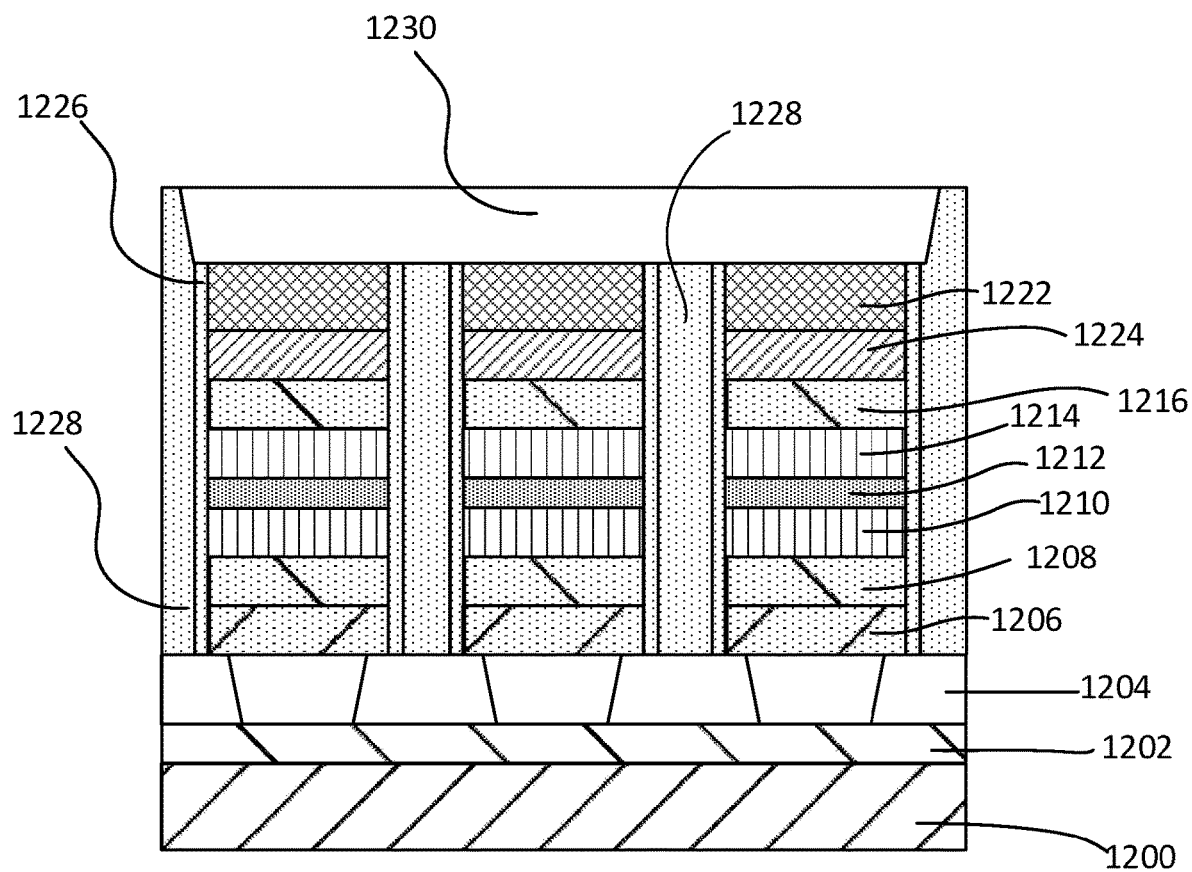
FIG. 12 is a cross-sectional view of the plurality of double magnetic junction devices shown in FIG. 11, with the addition of a low-k layer and an upper metal layer, according to embodiments.

Referring now to FIG. 12, a low-k layer 1228 is formed between the DMTJ devices 1128 (see FIG. 11). In general, in semiconductor manufacturing, a low-k is a material with a small relative dielectric constant relative to silicon dioxide. The low-k dielectric material layer separates the conducting parts (wire interconnects and transistors) of the different DMTJ devices 1128 from one another. A metal line layer 1230 is formed on top of the DMTJ devices.

Figure 13:
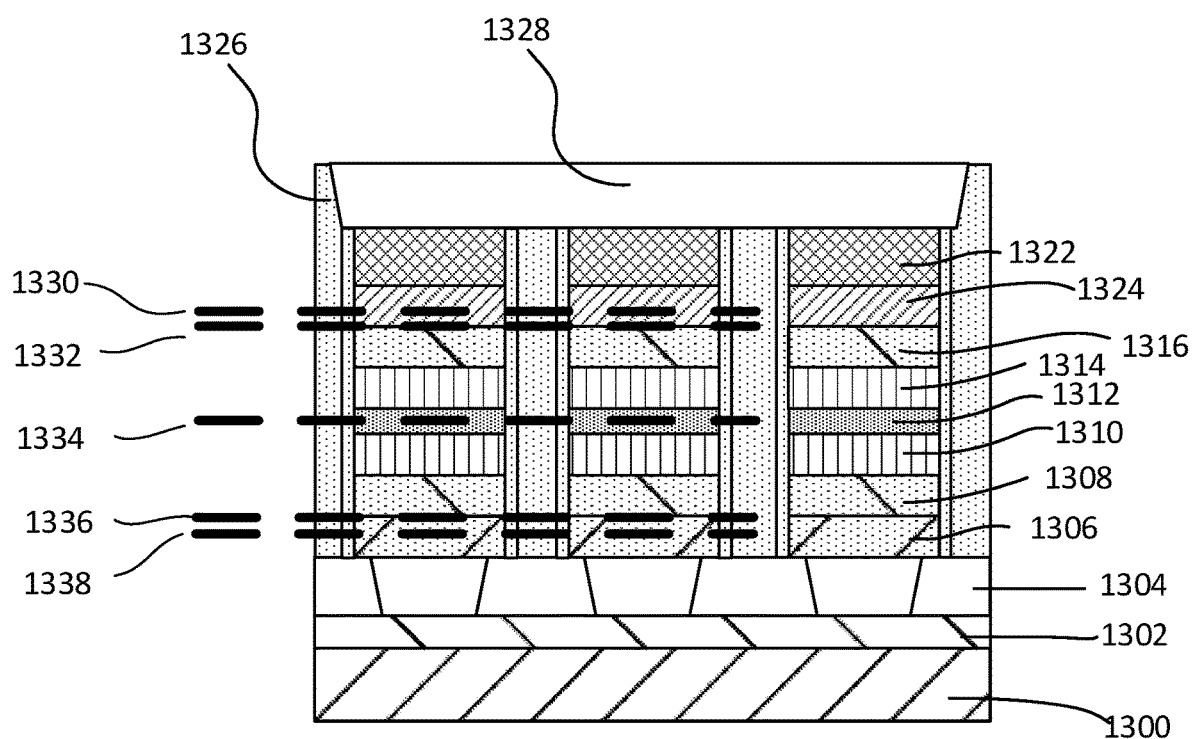
FIG. 13 is a cross-sectional view of the plurality of double magnetic junction devices shown in FIG. 12 and depicting different bonding locations, according to embodiments.

Referring now to FIG. 13, in certain embodiments, the bonding interface between the first and second MTJ stacks can occur in different locations. That is, the first and second MTJ stacks (see FIGS. 7, 726 and 728) can be formed with different number of layers than that shown in FIG. 7. Bonding interface 1332 is between the second reference layer 1324 and the second tunnel barrier layer 1316 and is the example location discussed above with regard to FIG. 7. In the embodiment shown in FIG. 13, the second reference layer 1324 and the first reference layer 1306 have a plurality of sublayers. Similarly, bonding interface 1336 is between the first reference layer 1306 and the first tunnel barrier layer 1308 and is analogous to bonding interface 1332.

Bonding interface 1330 is between two of the sublayers of the second reference layer 1324. Thus, a plurality of sublayers of the second reference layer 1324 are formed during formation of the second MTJ stack 726 (see, FIG. 7) and at least one sublayer of the second reference layer is formed during formation of the first MTJ stack 728 (see, FIG. 7). Similarly, bonding interface 1338 is between two of the sublayers of the first reference layer 1306. Thus, at least one sublayer of the first reference layer 1306 is formed during formation of the second MTJ stack 726 (see, FIG. 7) and a plurality of sublayers of the first reference layer 1306 are formed during formation of the first MTJ stack 728 (see, FIG. 7).

Bonding interface 1334 is between sublayers of the metal spacer layer 1312. Thus, at least one sublayer of the metal spacer layer 1312 is formed on the first MTJ stack 728 and at least one sublayer of the metal spacer layer 1312 is formed on the second MTJ stack 726. It should be appreciated that other locations for the bonding interface can occur as long as the first reference layer is formed during formation of the first MTJ stack and the second reference layer is formed during formation of the second MTJ stack, and as long as neither of the free layers 1310 and 1314 are the outermost layer. That is, the free layers would not form part of the bonding interface when joining the first and second MTJ stacks together. Also, the separate formation of the reference layers on the first and second MTJ stacks allow for higher quality reference layers relative to related art techniques, and this results in DMTJ devices with a high TMR level and write efficiency.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of manufacturing a double magnetic tunnel junction device, the method comprising:
    forming a first magnetic tunnel junction stack, the first magnetic tunnel junction stack including a first reference layer;
    forming a second magnetic tunnel junction stack, the second magnetic tunnel junction stack including a second reference layer; and
    wafer bonding the first magnetic tunnel junction stack to the second magnetic tunnel junction stack with ultra-high vacuum (UHV) bonding to form the double magnetic tunnel junction device.

2. The method according to claim 1, wherein forming the first magnetic tunnel junction stack includes:
    providing a first substrate;
    forming the first reference layer on the first substrate;
    forming a first tunnel barrier layer on the first reference layer;
    forming a first magnetic free layer on the first tunnel barrier layer;
    forming a second magnetic free layer on the first magnetic free layer; and
    forming a second tunnel barrier layer on the second magnetic free layer.

3. The method according to claim 2, wherein forming the second magnetic tunnel junction stack includes:
    providing a second substrate; and
    forming a second reference layer on the second substrate.

4. The method according to claim 2, further comprising forming a metal spacer layer between the first magnetic free layer and the second magnetic free layer.

5. The method according to claim 1, wherein forming the first magnetic tunnel junction stack includes:
    providing a first substrate;
    forming the first reference layer on the first substrate;
    forming a first tunnel barrier layer on the first reference layer; and
    forming a first magnetic free layer on the first tunnel barrier layer.

6. The method according to claim 5, wherein forming the second magnetic tunnel junction stack includes:
    providing a second substrate;
    forming the second reference layer on the second substrate;
    forming a second tunnel barrier layer on the second reference layer; and
    forming a second magnetic free layer on the second tunnel barrier layer.

7. The method according to claim 6, further comprising forming a metal spacer layer between the first magnetic free layer and the second magnetic free layer.

8. The method according to claim 1, wherein the first reference layer comprises a plurality of sublayers, and an outermost sublayer of the first reference layer comprises CoFeB, and wherein the second reference layer comprises a plurality of sublayers, and an outermost sublayer of the second reference layer comprises CoFeB.

9. The method according to claim 1, wherein the first magnetic tunnel junction stack is formed in a first UHV system, the second magnetic tunnel junction stack is formed in a second UHV system, and the first and second UVH systems are connected under the same UVH conditions throughout their formation and subsequent wafer bonding.

10. The method according to claim 1, wherein the wafer bonding occurs at an interface between the first and second magnetic tunnel junction stacks, the interface being one selected from:
    an interface between a tunnel barrier layer of the first magnetic tunnel junction stack and the second reference layer of the second magnetic tunnel junction stack;
    an interface between a sublayer of the second reference layer of the second magnetic tunnel junction stack and a sublayer of a third reference layer of the first magnetic tunnel junction stack;
    an interface between the first reference layer of the first magnetic tunnel junction stack and a tunnel barrier layer of the second magnetic tunnel junction stack; and
    an interface between a first metal spacer layer of the first magnetic tunnel junction stack and a second metal spacer layer of the second magnetic tunnel junction stack.

* * * * *